(12) United States Patent
Wimplinger

(10) Patent No.: US 8,932,910 B2
(45) Date of Patent: Jan. 13, 2015

(54) METHOD FOR PRODUCING CHIP STACKS, AND A CARRIER FOR CARRYING OUT THE METHOD

(75) Inventor: Markus Wimplinger, Ried im Innkreis (AT)

(73) Assignee: EV Group E. Thallner GmbH, St. Florian am Inn (AT)

(*) Notice: Subject to any disclaimer, the term of this patent is extended or adjusted under 35 U.S.C. 154(b) by 0 days.

(21) Appl. No.: 13/698,088

(22) PCT Filed: May 20, 2010

(86) PCT No.: PCT/EP2010/003119
§ 371 (c)(1),
(2), (4) Date: Nov. 15, 2012

(87) PCT Pub. No.: WO2011/144226
PCT Pub. Date: Nov. 24, 2011

(65) Prior Publication Data
US 2013/0065360 A1 Mar. 14, 2013

(51) Int. Cl.
*H01L 21/50* (2006.01)
*H01L 25/065* (2006.01)
(Continued)

(52) U.S. Cl.
CPC .......... *H01L 25/0657* (2013.01); *H01L 21/561* (2013.01); *H01L 21/6835* (2013.01); *H01L 23/3128* (2013.01); *H01L 23/5389* (2013.01); *H01L 24/24* (2013.01); *H01L 24/97* (2013.01); *H01L 25/50* (2013.01); *H01L 24/16* (2013.01); *H01L 24/32* (2013.01); *H01L 24/48* (2013.01); *H01L 2221/68318* (2013.01);
(Continued)

(58) Field of Classification Search
USPC .......................................................... 438/109
See application file for complete search history.

(56) References Cited

U.S. PATENT DOCUMENTS 7,696,065 B2 * 4/2010 Sato et al. ...................... 438/458
7,749,809 B2 * 7/2010 How et al. ...................... 438/110
(Continued)

FOREIGN PATENT DOCUMENTS

| EP | 1 890 326 | 2/2008 | ............. H01L 21/68 |
| EP | 2 104 138 A1 | 3/2008 | ............. H01L 21/98 |

(Continued)

OTHER PUBLICATIONS

Int'l Search Report from corresponding PCT/EP2010/003119 (Form PCT/ISA/210); 2 pages.
(Continued)

*Primary Examiner* — Angel Roman
(74) *Attorney, Agent, or Firm* — Kusner & Jaffe

(57) ABSTRACT

The invention relates to a method for producing chip stacks with the following method sequence:
applying an especially dielectric and/or photostructurable base layer to one carrier side of a carrier which on its carrier side is provided with an adhesively acting adhesion zone and a less adhesively acting support zone, the base layer being applied largely over the entire surface at least to the support zone,
building up the chip stacks on the base layer,
potting of the chip stacks,
detaching the carrier from the base layer.
Moreover the invention relates to a carrier for executing this method.

23 Claims, 15 Drawing Sheets

(51) Int. Cl.
*H01L 21/56* (2006.01)
*H01L 21/683* (2006.01)
*H01L 23/31* (2006.01)
*H01L 23/538* (2006.01)
*H01L 23/00* (2006.01)
*H01L 25/00* (2006.01)

(52) U.S. Cl.
CPC ............... *H01L 2221/68322* (2013.01); *H01L 2224/16145* (2013.01); *H01L 2224/16227* (2013.01); *H01L 2224/24137* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/81001* (2013.01); *H01L 2224/83001* (2013.01); *H01L 2224/85001* (2013.01); *H01L 2224/92244* (2013.01); *H01L 2224/97* (2013.01); *H01L 2225/06513* (2013.01); *H01L 2225/06517* (2013.01); *H01L 2225/06541* (2013.01); *H01L 2924/01013* (2013.01); *H01L 2924/01029* (2013.01); *H01L 2924/01032* (2013.01); *H01L 2924/01049* (2013.01); *H01L 2924/01052* (2013.01); *H01L 2924/01057* (2013.01); *H01L 2924/0106* (2013.01); *H01L 2924/01077* (2013.01); *H01L 2924/01079* (2013.01); *H01L 2924/01082* (2013.01); *H01L 2924/15174* (2013.01); *H01L 2924/15311* (2013.01); *H01L 2924/01005* (2013.01); *H01L 2924/01006* (2013.01); *H01L 2924/01023* (2013.01); *H01L 2924/01033* (2013.01); *H01L 2224/13025* (2013.01); *H01L 2224/16225* (2013.01); *H01L 2924/01327* (2013.01); *H01L 2224/81005* (2013.01); *H01L 2924/01322* (2013.01); *H01L 2924/10253* (2013.01)
USPC ............ 438/109; 438/106; 438/107; 438/455; 438/459; 257/686; 257/E21.001

(56) References Cited

U.S. PATENT DOCUMENTS

| | | | | |
|---|---|---|---|---|
| 7,883,991 | B1* | 2/2011 | Wu et al. | 438/459 |
| 2006/0035443 | A1* | 2/2006 | Hsu et al. | 438/464 |
| 2008/0268614 | A1* | 10/2008 | Yang et al. | 438/455 |
| 2009/0181533 | A1* | 7/2009 | Gorrell et al. | 438/613 |
| 2009/0218560 | A1* | 9/2009 | Flaim et al. | 257/9 |
| 2010/0006994 | A1* | 1/2010 | Shim et al. | 257/676 |
| 2010/0105167 | A1* | 4/2010 | Eskridge et al. | 438/107 |
| 2011/0020982 | A1 | 1/2011 | Wimplinger | 438/107 |
| 2011/0195545 | A1* | 8/2011 | Wang | 438/113 |

FOREIGN PATENT DOCUMENTS

| | | | | |
|---|---|---|---|---|
| JP | 2001-85606 | | 3/2001 | ............ H01L 25/065 |
| JP | 2008-211187 | | 9/2008 | ............ H01L 23/12 |
| JP | 2009-188328 | | 8/2009 | ............ H01L 25/065 |
| JP | 2011-510518 | | 3/2011 | ............ H01L 21/02 |
| WO | WO 2006/109383 | | 10/2006 | ............ H01L 21/60 |
| WO | WO 2009/094558 | A2 | 7/2009 | ............ H01L 23/48 |

OTHER PUBLICATIONS

Notification of Reasons for Refusal issued in connection with related Japanese Patent Application No. JP 2013-510503, dated Aug. 11, 2014 (including English translation).

* cited by examiner

Fig. 5A
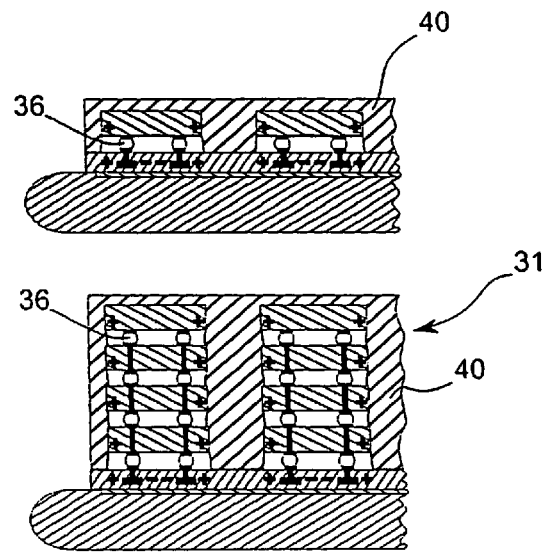
Fig. 5B
Fig. 5C
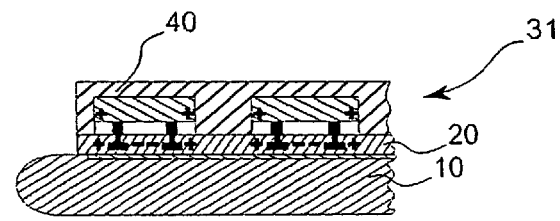
Fig. 5D
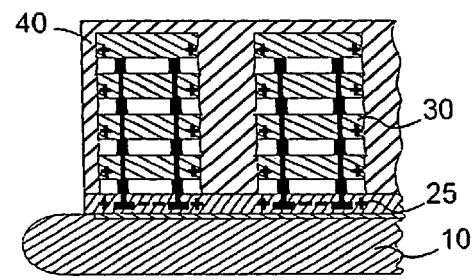
Fig. 5E
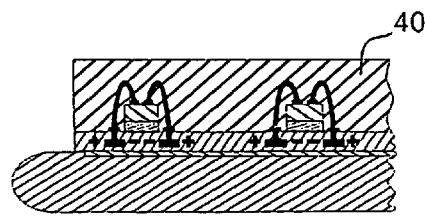

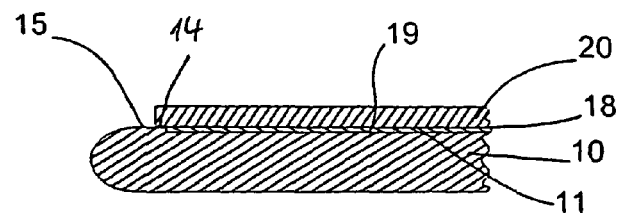
Fig. 9 F1
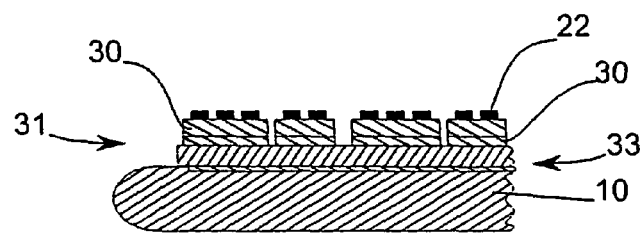
Fig. 9 F2
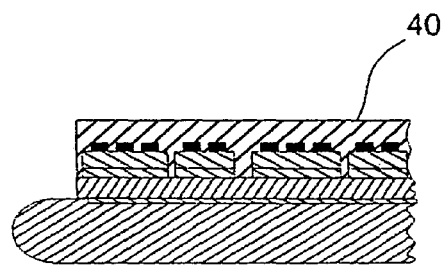
Fig. 9 F3
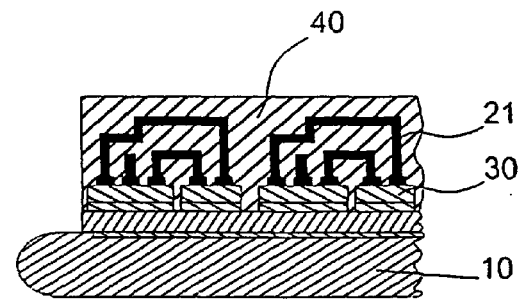
Fig. 9 F4
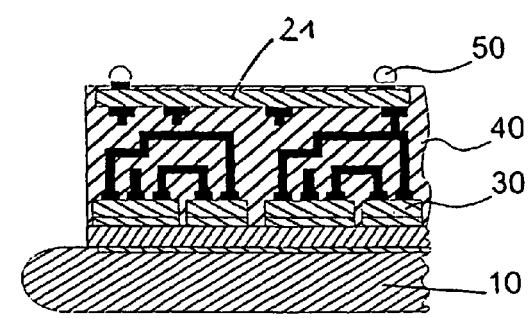
Fig. 9 F5

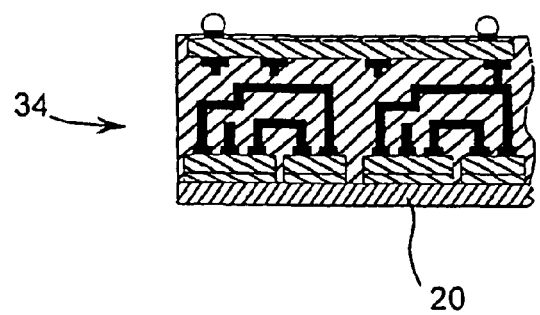
Fig. 9 F6
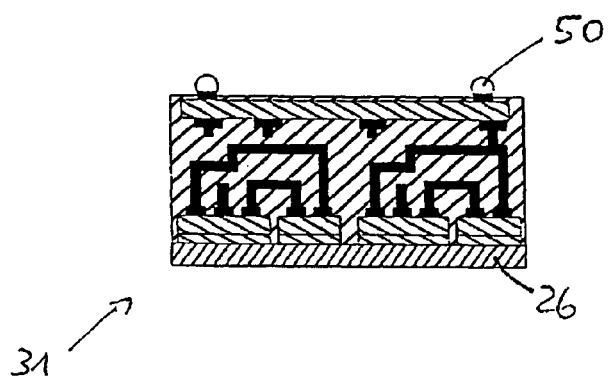
Fig. 9 F7

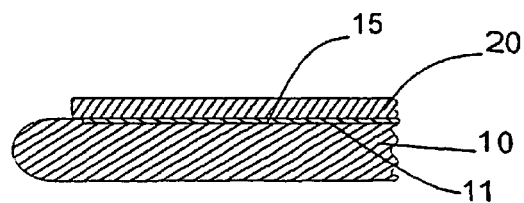
Fig. 10 G1
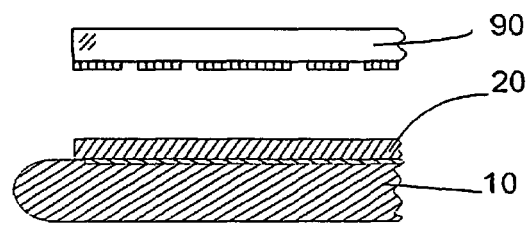
Fig. 10 G2
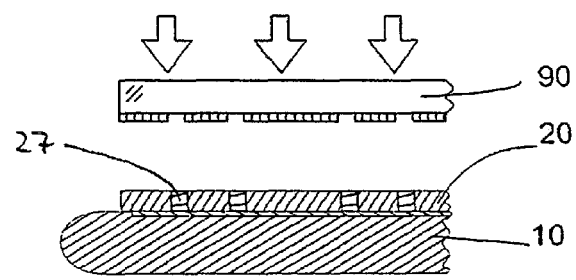
Fig. 10 G3
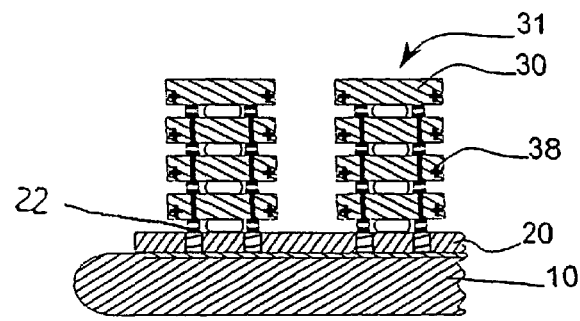
Fig. 10 G4
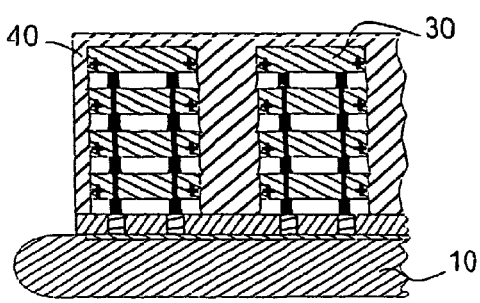
Fig. 10 G5

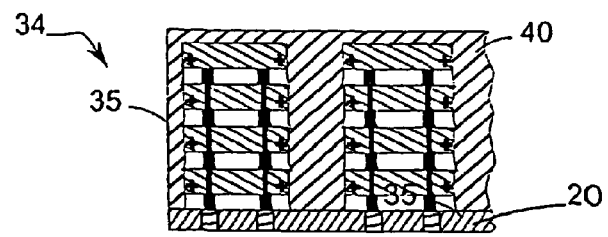
Fig. 10 G6
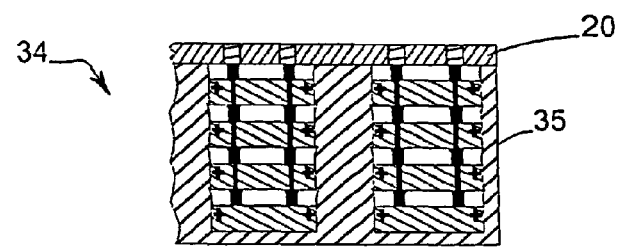
Fig. 10 G7
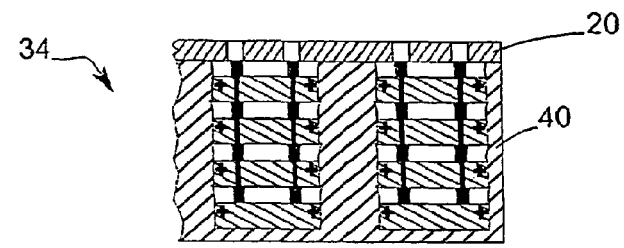
Fig. 10 G8
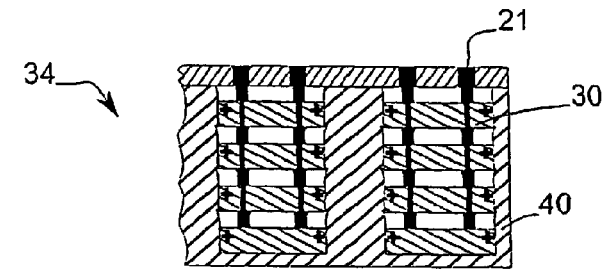
Fig. 10 G9
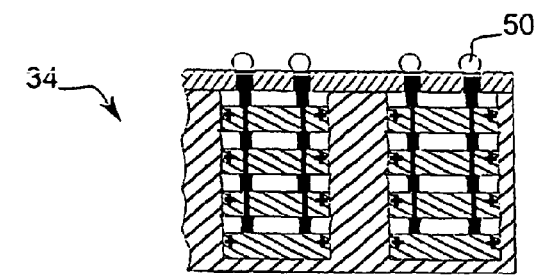
Fig. 10 G10

Fig. 10 G11 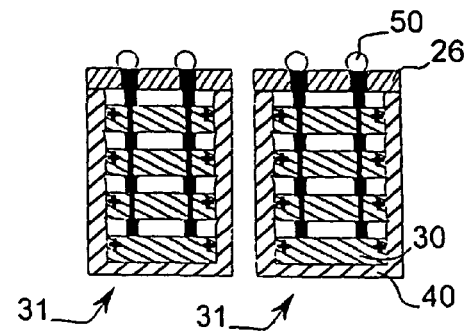

Fig. 11 H1
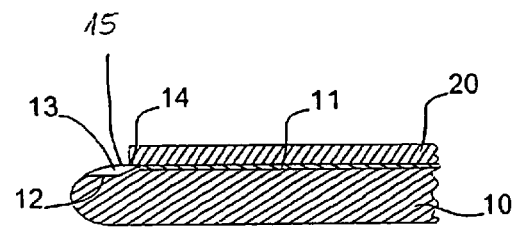
Fig. 11 H2
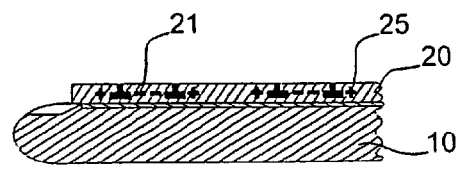
Fig. 11 H3
Fig. 11 H4
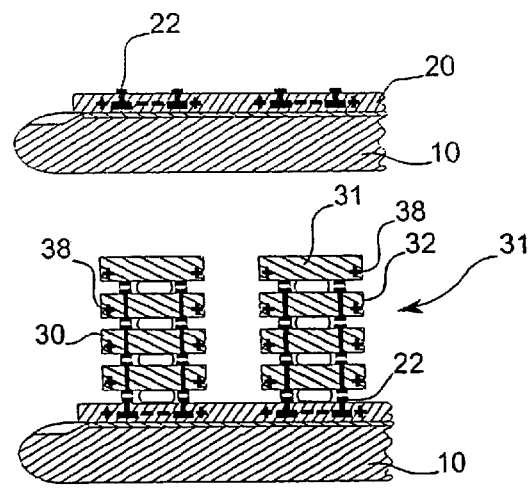
Fig. 11 H5
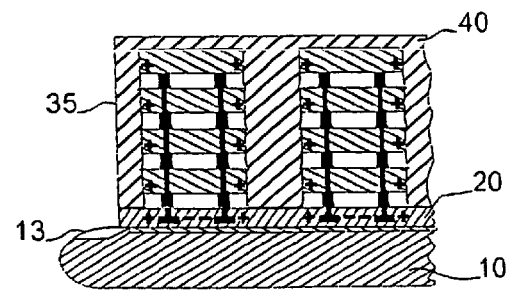

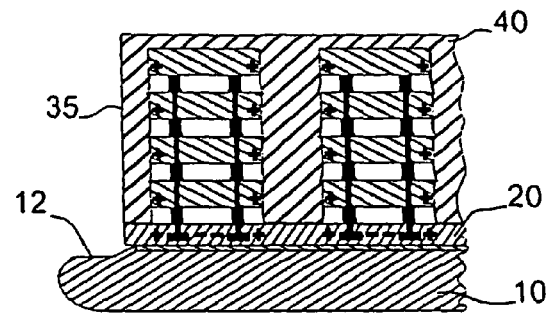
Fig. 11 H6
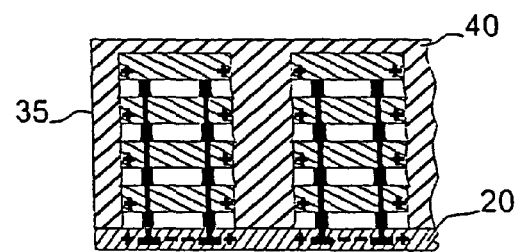
Fig. 11 H7
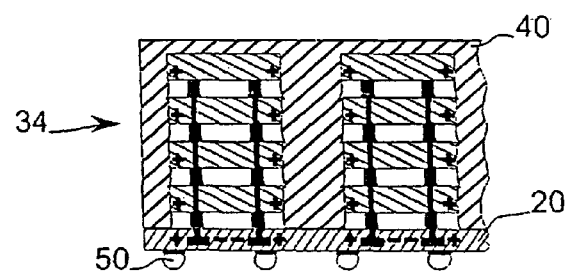
Fig. 11 H8
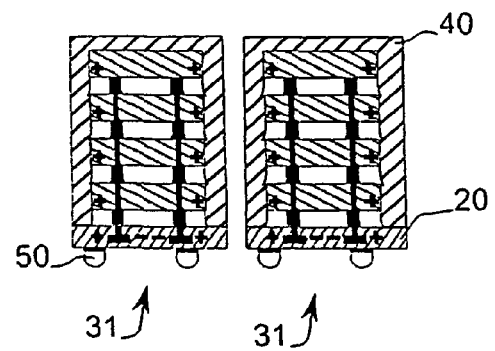
Fig. 11 H9

METHOD FOR PRODUCING CHIP STACKS, AND A CARRIER FOR CARRYING OUT THE METHOD

FIELD OF THE INVENTION

This invention relates to a method for producing chip stacks and a carrier for producing the same.

BACKGROUND OF THE INVENTION

Due to the continuing miniaturization of structures which are present on semiconductor chips and due to existing cost pressure in mass production of semiconductor chips, new methods and architectures are required to interconnect the semiconductor chips with their structures, which are becoming smaller and smaller, to corresponding structures on circuit boards or to adjacent chips. Here mainly the size difference of structures and connecting lines on the chip compared to conventional structures on circuit boards constitutes a technical problem. The structures of the circuit boards are also being further miniaturized and refined in order to keep up with progress in chip manufacture. Due to the existing cost pressure there is however a demand for use of more favorable circuit boards with bonding structures which have a less fine structure compared to the chip structures. This is because different types of chips, especially chips with different degrees of miniaturization, must be applied to the circuit boards so that in the production of the circuit boards as a result of further miniaturization of the bonding structures economical production would no longer be possible. Chips with a high connection density would determine the choice of circuit board material and the production process for the circuit boards.

Another technical problem is that the circuit boards of conventional design have thermal expansion which is very different from that of semiconductor materials such as silicon and germanium. To prevent the difference in thermal expansion between the circuit board and the semiconductor material from leading to fatigue fracture, in many cases also certain minimum dimensions of the connecting structures (often implemented with so-called bumps consisting of generally eutectic metal alloys) between the chips and the circuit boards must be maintained. For stabilization of chips in chip stacks or on the circuit board moreover fill materials must often be introduced into the gaps; this leads to problems in further miniaturization of the connecting structures.

Among others, due to the aforementioned technical problems chips are produced by so-called fan-out bonding structures. Here a semiconductor chip or chip stack is potted in a fill material which is used to enlarge the base area of the chip and thus to have available more space for connections. The very densely packed terminals on the semiconductor chip are widened on the larger area which consists of the semiconductor chip and the filler material (fan-out). The widened structures can then be connected to the circuit board via bumps.

Existing methods for producing chips with fan-out bonding structures are based on an adhesive, on which the chips are placed, being applied to the carrier. The adhesive is for example an adhesive film which is laminated onto the carrier. The chips are applied to the adhesive film with a pick-and-place tool and are then potted with a layer material (molding compound). After detaching the resulting hybrid wafers from chips and layer material (molding compound) the fan-out bonding structures are produced on the front.

Detachment of the hybrid wafer from the carrier poses technical problems in the existing method, especially due to the above described soluble adhesive connections. Mainly temporary connections are used and the adhesive connections often react with the materials used for potting. In the existing methods therefore special attention must be focused on the adhesives being compatible with the material used for potting of the chips both chemically and mechanically and mainly with respect to the process temperatures which are used.

Due to the carrier materials which have been used and which are conventionally chosen from the group of metals, ceramic, or semiconductor materials, UV-soluble adhesives or adhesives which are dissolved by means of irradiation by a light source, such as for example a laser, are precluded since these carriers are conventionally not transparent to the wavelengths necessary for dissolving the adhesives.

But thermally soluble adhesives such as for example double-sided adhesive tapes or thermally soluble adhesives with thermoplastic behavior also pose technical problems. The adhesives generally do not have the necessary temperature stability which in conventional adhesives generally extends up to 150° Celsius or a maximum 200° C. Celsius. Moreover the adhesives are less resistant to mechanical deformation as the temperature rises, as a result of which chips during potting can slip and in the worst case no longer have any contact with the corresponding bonding terminals. Potting conventionally takes place at a temperature between 150° Celsius and 200° Celsius.

Another problem consists in that many materials which are used for potting are only conditionally compatible with the available temporary adhesives since they interact with the materials used for potting. Therefore it has been necessary so far to qualify the interaction of each individual potting material intended for use with the adhesives which have been used. In this way in practice the amount of usable materials is greatly limited so that reaction to requirements in the production of chips becomes less flexible.

Another problem is in the production of chip stacks which are stacked in several layers of chips and which are to be connected to one another in an electrically conductive manner. The chip stacks, also called 3D packages, have through silicon vias (TSVs) which allow direct stacking and electrical connection of chips. The production of these electrical connections which are in practice generally metallic solder connections or diffusion bonding connections generally requires temperatures beyond 200° Celsius, even partially up to 300° Celsius. At these temperatures all adhesives known at present fail.

Another technical problem is the lack of transparency of most known adhesives with respect to visible light, since in particular when chips are being placed by means of pick and place equipment exact alignment is possible only for correspondingly transparent adhesives. The alignment accuracy therefore suffers in many adhesives so that in special cases so called global alignment is used in which the chips are placed in a predefined grid with the aid of an external reference system (which does not belong to the wafer). Generally this reference system is formed by the stage (holding means) and the sensors of the pick and place system which belong to the stage. This entails the disadvantage that possible thermal expansions of the entire system directly influence the alignment accuracy. As a result, the structure of the pick and place system must be correspondingly durable and stable in order to eliminate these effects and the tendency to a drift of alignment accuracy. This greatly increases costs for alignment.

To the extent a thermal or thermomechanical process is to be used when the hybrid wafer is detached from the carrier, there is the problem that the temperature for the molding compound materials is critical to intolerable here. The materials when heated lose mechanical stability; this makes detachment from the carrier in the heated state at least difficult. Here the alignment accuracy of the individual chips in the grid, which is a prerequisite for further successful processing of the hybrid wafer, can also be adversely affected. For example, in the terminal the very densely packed connecting pads on the individual chips are to be bonded to contacts which are defined by means of lithography in thin film technology. The contacts, which require the finest structure sizes, are delicately the most critical. In other words, the contacts which are provided directly on the chips have the finest resolution and the greatest density compared to the other layers, while the chips have the greatest variation with respect to lateral (X-Y plane) alignment accuracy. The other connecting layers, compared to the first high resolution layer with respect to lateral positioning accuracy of the individual structures, require a much smaller (factor of 2 to a factor of 5) lateral positioning accuracy than the chips.

In summary therefore the problems are as follows:
chemical stability of the adhesives used
thermal stability of the adhesives used
thermomechanical stability of the adhesives used
lack of transparency of the adhesives used (alignment accuracy)
alignment accuracy of chips (floating)
temperature in the detachment process

SUMMARY OF THE INVENTION

Therefore the object of the invention is to devise a method for producing chip stacks with fan-out bonding structures without the aforementioned limitations with respect to thermal stability, thermomechanical stability and/or chemical compatibility of the carrier with the materials used to build up the hybrid wafer and subsequent processes. Another object consists in increasing the alignment accuracy during placement and when building up the chips and as much as possible at the same time in reducing the costs in production.

This object is achieved with the features of claim 1. Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The invention is based on the idea of bonding the chip stacks, consisting of at least one chip layer, no longer directly on a carrier, but first applying to the carrier a, in particular dielectric or insulating and/or photostructurable, base layer on which in turn the chip stack is built up. Advantageously it is especially conceivable as claimed in the invention for the base layer to become at least in part a component of the chip stacks or of the hybrid wafer which is to be produced. In particular, expensive temporary adhesives can be at least largely omitted.

As claimed in the invention, the base layer is applied to the carrier, at least largely to a support zone with reduced adhesion force, the support zone comprising most of the area of the hybrid wafer to be produced or a large part of the area of the carrier. It is conceivable here as claimed in the invention that only the one on the outermost edge of the hybrid wafer to be produced or the chip stack to be produced there is an adhesion zone with high adhesion force on the carrier [sic]. In other words: the carrier holds the base layer and the chip stacks of at least one layer of chips, which stack is to be built up on the base layer, more or less exclusively on the periphery of the base layer, the contact surface being flat between the base layer and the carrier.

The adhesion force of the adhesion zone to the base layer as claimed in the invention per area is especially at least three times, preferably at least five times, even more preferably at least ten times, ideally at least twenty times, thicker than the adhesion force of the support zone.

For the purposes of the invention the carriers can be any material suitable for producing the hybrid wafer or the piece chip stacks. Especially preferred materials are those which are chosen from the groups of metal, ceramic or semiconductor, as well as quartz, glass or the like. It is also conceivable to produce a carrier consisting of a combination of these materials. The carrier can have any shape, but is advantageously square, rectangular, or especially round. One embodiment of a carrier in the shape of a round substrate with dimensions which are similar or identical to standard silicon wafers is especially advantageous, since in this case established available production machines and infrastructure can be used.

The invention comprises applying a base layer to a carrier which compared to the material used for potting of the chip stack has better properties both in a chemical and also a thermal respect and in a thermomechanical respect, especially in conjunction with the detachment of the carrier from the base layer which is greatly simplified by fixing on the edge of the base layer. Both the flexibility and also the attainable alignment accuracy are greatly improved as a result of the base layer which is not potted by a layer material (molding compound). Furthermore, the production costs are improved by omitting expensive material combinations, especially with respect to temporary adhesives. Finally, and last but not least, only this invention makes it possible to process several chip layers into chip stacks with conductor paths which electrically connect the chips/chip stacks, especially fan-out bonding structures.

In another independent configuration as claimed in the invention it is provided that the base layer can be structured by a stamping process, for example hot stamping or UV stamping methods (based on materials which can be crosslinked by irradiation by means of ultraviolet light), especially consists of plastic, for producing chip stacks which are formed from at least one plastic chip. In this case, it is conceivable that silicon can be completely omitted as claimed in the invention. The embodiment would find advantageous application in microfluidics, such as, the production of a microfluid chip, and impressively shows the versatility of the method as claimed in the invention. The method step of building up the chip stacks then consists in the most general execution of this version solely in that the base layer is structured especially by a stamping method, such as for example hot stamping or a UV stamping method, and optionally metal coating and/or encapsulation of the structures takes place by means of a subsequent bonding method.

These stamping methods can also be used for especially economical production of electrical connections which extend through the molding compound (so-called through mold vias or TMV for short). Here the potting of the chips is carried out in a manner in which the potting tool has the desired structures, for example for producing through mold vias in the molding compound. During the potting process, the potting tool is pressed into the liquid molding compound mass and the negative structures machined into the tool displace the molding compound at the intended sites. After curing of the molding compound materials, the desired positive structures remain in the cured molding compound material. In this way, for example, through-mold vias can be produced, which following a given time in the production process flow, can be filled using methods conventional in the industry, especially for example electrochemical deposition of metals. This can be especially useful for applications in which for example two chip stacks which have been produced in this way are to be in turn stacked and electrically connected to one another. The TMV contacts which have been produced in the just described manner enable simple and space-saving electrically conductive connection of the two chip stacks.

According to one advantageous embodiment of this invention, it is provided that on the carrier side in the adhesion zone there is a selectively soluble fill material, especially on an offset which has been set back relative to the carrier side, preferably filling superficially flush toward the carrier side. This measure enables detachment of the carrier from the hybrid wafer or the chip stacks in an especially careful manner by the fill material being dissolved selectively by corresponding solvents which are either nonselective with respect to the other materials or which can be at least largely compartmented by it.

The described carrier can be regarded as an independent invention for executing the method.

By the base layer being applied to the support zone and at least in part the adhesion zone over the entire surface, the area which is available on the carrier can be used almost completely for producing the chip stacks. For a carrier diameter of 300 mm the distance, especially the ring width, from the edge of the adhesion zone to the edge of the support zone is between 0.5 mm and 10 mm, especially between 1 mm and 5 mm, preferably between 2 mm and 4 mm.

According to another advantageous embodiment of the invention, it is provided that the chip stacks are separated before detachment of the carrier, especially by cutting, so that the chip stacks are only connected to the carrier. In this case, at the same time the base layer is cut into base parts which are assigned to the chip stacks.

One embodiment is especially advantageous in which the material which forms the base layer is flexible, especially in conjunction with the measure that instead of potting with a layer material (molding compound), the material which forms the base layer is used for potting. This makes it possible to produce especially thin and compact packages which on the one hand have very high mechanical durability and on the other which are mechanically flexible (pliable). This is especially advantageous for special applications in which the flexibility is important, especially smart cards or in later attachment of the packages to a bent surface.

According to one especially advantageous embodiment of the invention it is provided that especially before building up the chip stacks, fan-out bonding structures are made in the base layer. In this way the base layer is used for another purpose and thus forms another functional component of the chip stacks or of the hybrid wafer. In this case the possibility of subjecting these fan-out bonding structures before placement of the chips to quality tests with which possible faults in these structures are prevented from leading to chips or chip stacks being applied to nonfunctional fan-out bonding structures is especially advantageous.

The fan-out bonding structures widen the available fan-out contact surface relative to the chip contact surface of the chip which corresponds at the time, especially at least by a factor of 1.5, preferably a factor of 2, more preferably a factor of 3, ideally a factor of 4.

It is especially advantageous if before building up the chip stacks on the chip side facing away from a carrier side contact pads are applied for electrical bonding of the chip stacks with the fan-out bonding structures.

Furthermore, it is advantageous before or during the build-up of the chip stacks, especially at the same time with the introduction of the bonding structures, to provide alignment marks for positioning of the contact pads and/or the chip stacks on the base layer, especially flush with one edge of the chip stacks, in/on the base layer. Alternatively these alignment marks can correspond to alignment marks located on the individual chips. In this way the base layer performs another, additional function and by the prescribed measure the alignment accuracy of the chips/chip stacks is further increased. It is especially advantageous if the base layer is a photostructurable material, especially a photostructurable dielectric.

According to one alternative independent embodiment it is provided that the chip stacks are bonded directly onto the base layer by bonding (adhesion). This can take place either with the aid of an additional adhesive or using possible adhesive properties of the material of the base layer. Thus it is conceivable as claimed in the invention for the chips to be cemented by means of a so-called die attach adhesive. Alternatively it is conceivable as claimed in the invention that the material of the base layer is a dielectric which in the unexposed state largely has the behavior of a thermoplastic. Thus the chips can be fixed by means of a thermoplastic adhesive process.

It is especially advantageous if after building up the chip stacks and before detaching the carrier the chip stacks are potted, especially with a layer material which corresponds to the base layer, since in this way especially flexible and at the same time stable chip stacks or hybrid wafers can be formed.

According to another alternative embodiment of the invention it is provided that the detachment of the carrier from one side edge of the carrier, especially by reducing the adhesion force of the adhesion layer, takes place preferably by selective dissolution of the filler material. The detachment of the carrier from the base layer and the chip stack applied to the base layer, especially for the potting material, is carefully implemented by this measure as claimed in the invention.

The carrier is detached from the base layer as claimed in the invention by connection release means, which act especially on the adhesion zone, and the adhesion means which act in the adhesion zone between the base layer and the carrier.

The connection release means can be fluid agents, especially a solvent which selectively dissolves the connection. The chemical dissolution is especially careful and with a corresponding material choice the dissolution can also take place quickly, especially when only edge regions of the carrier or the base layer are provided with an adhesion layer so that the solvent can act quickly from the side.

According to one alternative embodiment of the invention it is provided that the connection release means comprises mechanical separating means, especially a blade for mechanical separation of the base layer from the carrier in the adhesion zone, for dissolving the adhesion. A combination of mechanical separation means and fluid agents is also conceivable.

In another alternative embodiment of the invention it is provided that the connection release means comprises a UV light source for dissolving the adhesion between the base layer and the carrier. This embodiment can also be combined with the embodiment of the mechanical separating means and/or the embodiment with fluid agents.

To the extent the connection release means is made to act especially exclusively from one side edge of the carrier, action on the carrier and/or the hybrid wafer/chip stack from the top and/or bottom, especially a region of the carrier which lies within the side edge of the carrier or in the support zone, can often be omitted.

An arrangement of the connection release means over the entire periphery of the carrier can be omitted and partial action on the periphery of the carrier is sufficient by there being a rotation means for rotation of the carrier.

Advantageously, to expose the adhesion layer to fluid agents, for holding the fluid agent there is a solvent tank which touches, especially sealed, the carrier or carrier receiver. By the solvent tank at least partially enclosing the side edge or periphery of the carrier especially effective action on the connecting layer is possible. Furthermore the measure of enclosure can prevent the fluid agent from emerging from the solvent tank or UV light intensity being lost. When using mechanical separating means possible impurities are prevented from escaping from the solvent tank and contaminating the hybrid wafer or the chip stack. The solvent tank in an advantageous configuration can be made L- or U-shaped in cross section.

The dissolution of the adhesion layer, especially of the selectively soluble filler material, can be accelerated as claimed in the invention by a modulator which greatly accelerates the detachment of the carrier by means of ultrasonically or megasonically generated cavitation so that the detachment takes place much more carefully and at the same time more quickly. The modulator is in contact with the solvent used in order to ensure optimum sonic transmission. Advantageously the modulator is mechanically integrated into the L-shaped or U-shaped solvent tank. Alternatively the modulator can also be immersed into the solvent as soon as the solvent has been supplied in the intended manner for separating the adhesion layer.

This invention moreover relates to a carrier which is provided on one carrier side with an adhesively acting adhesion zone and a less adhesively acting support zone, a base layer (20) being applicable largely over the entire surface at least to the support zone, and on the carrier side in the adhesion zone there being a selectively soluble filler material, especially on an offset which is set back relative to the carrier side, preferably superficially flush with the carrier side. With a carrier which has been equipped in this way, the method as claimed in the invention can be carried out in an especially advantageous manner since the detachment of the hybrid wafer or the chip stack from the carrier takes place at least largely without adversely affecting the chip stacks and the molding compound. In this way especially careful detachment of the expensive chip stack is ensured. Moreover it is conceivable as claimed in the invention to interconnect several adjacent chip stacks when the chip stacks are built up and/or the fan-out bonding structures are formed into chip stack structures (see embodiment F).

It is furthermore advantageously provided that the detachment of the carrier takes place concentrically from the periphery of the carrier to the center of the carrier.

Other advantages, features and details of the invention will become apparent from the following description of preferred exemplary embodiments and using the drawings.

BRIEF DESCRIPTION OF THE DRAWINGS

FIGS. 1A to 1E, 9F1, 10G1 and 11H1 show a schematic view of a step of application of a base layer to a carrier as claimed in the invention according to embodiments A to H, FIGS. 2A to 2E and 11H2 show a schematic view of a step of introducing fan-out bonding structures and alignment marks into the base layer as claimed in the invention according to embodiments A to E and H, FIGS. 3A to 3E and 11H3 show a schematic view of a step of placing contact pads on the base layer as claimed in the invention according to embodiments A to E and H, FIGS. 4A to 4E, 9F2, 10G4 and 11H4 show a schematic view of a step of stacking chips onto the base layer in at least one position as claimed in the invention according to embodiments A through H, FIGS. 5A to 5E, 10G5 and 11H5 show a schematic view of a step of potting the chips stacks with molding compound as claimed in the invention according to embodiments A to E, G and H, FIGS. 6A to 6E, 9F6, 10G6 and 11H7 show a schematic view of a step of detaching the base layer with chip stacks from the carrier according to embodiments A to H, FIGS. 7A to 7E, 10G10 and 11H8 show a schematic view of a step of applying soldered connections (bumps) as claimed in the invention according to embodiments A to E, G and H, FIGS. 8A to 8E, 9F7, 10G11 and 11H9 show a schematic view of a step of separating the chip stacks or the hybrid wafer on the carrier as claimed in the invention according to embodiments A to H, FIG. 9F3 shows a schematic view of a step of potting with a layer material which corresponds to the base layer as claimed in the invention according to embodiment F, FIG. 9F4 shows a schematic view of a step of introducing fan-out bonding structures as claimed in the invention according to embodiment F, FIG. 9F5 shows a schematic view of a step of applying another chip later and soldered connections (bumps) as claimed in the invention according to embodiment F, FIG. 10G2 shows a schematic view of a lithography step as claimed in the invention according to embodiment G, FIG. 10G3 shows a schematic view of a lithography step as claimed in the invention according to embodiment G, FIG. 10G7 shows a schematic view of a step for rotating the hybrid wafer by 180° as claimed in the invention according to embodiment G, FIG. 10G8 shows a schematic view of an etching step as claimed in the invention according to embodiment G, FIG. 10G9 shows a schematic view of a step of introducing fan-out bonding structures as claimed in the invention according to embodiment G, FIG. 11H6 shows a schematic view of a step of dissolving a filler material as claimed in the invention according to embodiment H.

Figure 1A:
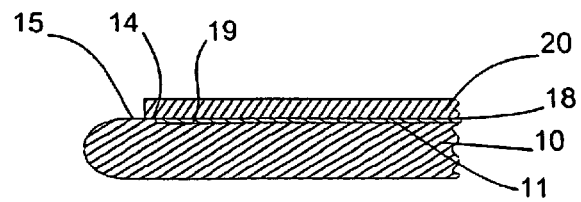
Figure 1B:
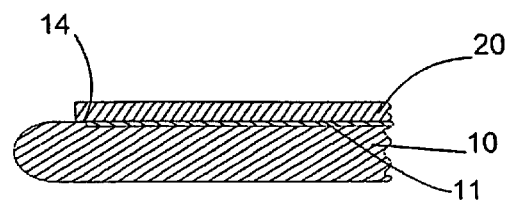
Figure 1C:
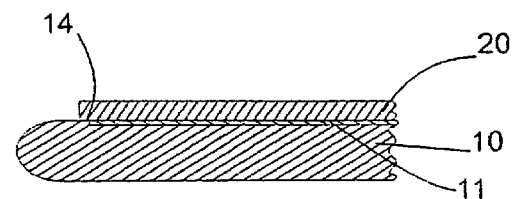
Figure 1D:
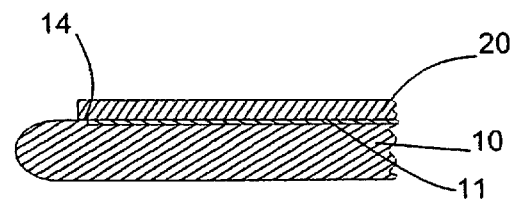
Figure 1E:
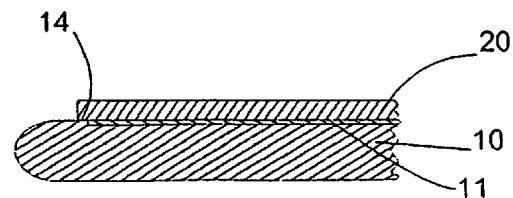

The figures show individual or multiple steps of the embodiments A to H, the labelling of the figures being identified with the reference letters A to H. The individual steps of embodiments A to E are each shown jointly on one side, while the steps of the embodiments F, G, and H are each shown as a sequence.

The representation is done without conventionally known devices for handling of the carrier and/or for executing the individual steps.

The reference numbers are used uniformly for the corresponding parts, even if different measures/materials are chosen for the different embodiments.

DETAILED DESCRIPTION OF PREFERRED EMBODIMENTS

According to the present invention, is that temporary adhesives for fixing the chips 30 or chip stacks 31 are avoided either entirely or at least for the most part. Instead, carriers 10 are used which have a support zone 11 with reduced adhesion force on the contact surface 18 between the hybrid wafer 34 and the carrier 10. This support zone 11 with reduced adhesion force bonds with most of the area of the hybrid wafer 34 which is to be produced and which in turn is comprised of a plurality of chip stacks 31 with at least one chip layer 33 at a time. The system is made such that only the especially annular contact surface 18 which is located on the outermost edge 35 of the hybrid wafer 34 which is to be produced comes to rest on the contact surface 18 on the carrier 10 on an adhesion zone 14 with high holding force/adhesion force.

For the purposes of the invention, the carriers 10 can be any materials which are suitable for producing the hybrid wafer 34. But typically materials are those selected from one of the groups metal, ceramic, or semiconductor as well as quartz, glass or the like. The carrier 10 in suitable embodiments has a circular shape and is made as a standard wafer with a 300 mm diameter.

The support zone 11 of the carrier 10 is formed by a fill layer 19 (see FIG. 1A) which is placed superficially flush in the carrier to the carrier side 15. The thickness of the fill layer 19 is at least 3 µm to 100 µm, preferably 10 µm to 50 µm.

The application/introduction of the fill layer 19 takes place for example by spin coating. The fill layer 19 is comprised of a material with 5 to 50% by weight solids, and more specifically, 15 to 30% by weight solids, the solids being selected from the group of monomers, oligomers and/or polymers, preferably cyclic olefin polymers and/or copolymers and/or amorphous fluoropolymers with high atomic fluorine content, especially more than 30% by weight, preferably more than 45% by weight.

In other words: The fill layer 19 has one or more of the properties described below:
It consists especially of amorphous polymer materials with low free surface energy,
It is of low adhesion to nonadhesive with respect to silicone, glass and/or metal surfaces by the fill layer 19, and has a low to very low concentration of hydroxyl groups or carboxylic acid groups at least on the surface,
It can be formed from a solution.

Figure 4A:
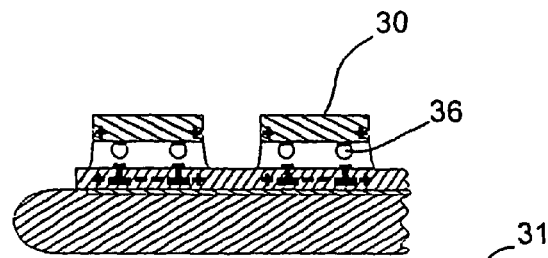
Figure 4B:
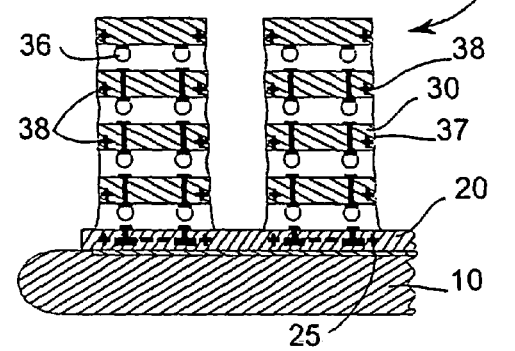
Figure 4C:
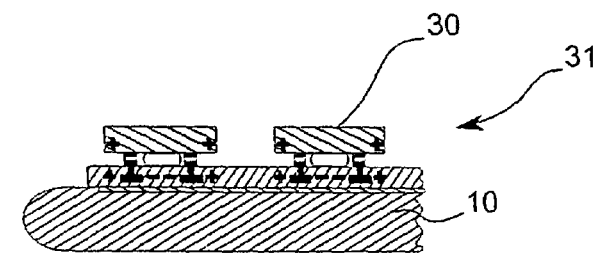

The stacking of chips 30, especially in several layers, is known to one skilled in the art. In the configuration as claimed in the invention the stacking is improved by each chip 30, especially on the chip edge 37, having chip alignment marks 38 which are used for alignment of the chips 30 relative to the alignment marks 25 of the base layer 20 (see FIG. 4B). The support zone 11 can be produced alternatively or can be treated on its surface by the steps cited below:
chemical treatment of the surface formed from silicone with a hydrophobic organosilane such as for example fluorine/alkyl phosphonate or (fluoro) alkyl silane for reducing the free surface energy, or
chemical vapor phase deposition (CVD method) of a coating with low free surface energy (for example fluorinated parylenes) on a carrier in order to produce a permanent anti-adhesion coating in the support zone or as the support zone.

The thickness of this coating is especially between 1 nm and 20 nm, preferably between 2 nm and 10 nm.

Production of such a support zone 11 which has been produced by chemical modification of at least parts of the surface of the carrier 10 proceeds as follows according to one preferred embodiment:
An epoxy-based photoresist is applied to a surface of a silicone wafer (carrier 10) with a diameter of 300 mm in an annular section (adhesion zone 14) on the outer periphery of the silicone wafer. The ring width is between 1 and 10 mm. A fluorinated silane is diluted with a suitable solvent to a one-percent solution. The solution is applied by spin coating to the surface of the silicone wafer. Then the wafer is hardened for one minute on a heating plate at 100° C. Thereupon the wafer is flushed in a spin coater and is hardened again for one minute at 100° C. The epoxy-based photoresist is then removed with acetone in a spin coater, as a result of which the annular adhesion zone remains as an adhesion zone which is untreated by the fluorinated silane solution. The carrier 10 with support zone 11 is completed.

Then a base layer 20 is applied to this carrier 10 largely over the entire surface. In particular the base layer 20 later becomes at least partially part of the hybrid wafer. In individual cases, it is however also conceivable that this base layer is used at least in part only temporarily during the build-up of the chip stacks. In this case, at a later time at a suitable location this layer would be largely completely removed again in the entire production process flow. In this connection, it is ideally regarded completely as removal of at least 99.5%, but more ideally 99.9% or still more ideally 99.99% of the originally present layer. In conjunction with this only temporarily used base layer, especially advantageous embodiments can be implemented, when this base layer is used for producing electrically conductive metallic connections which can be exposed and be made accessible later by removing the base layer 20. These processes are conventional in the semiconductor industry and known under the term "sacrificial layer". In order to be able to implement these structures, depending on the configuration of these structures, it can be advantageous if this base layer 20 is comprised of a photostructurable material. This connection covers at least 90% of the entire surface of the support zone 11 with reduced adhesive thickness. In optimized embodiments, this surface is however at least 98% or is even more ideally larger than the support zone 11. At a diameter of 300 mm of the round carrier 10 the adhesion zone 14 with high adhesive force typically has a ring of >0.5 mm, ideally >1 mm and even still more ideally >2 mm or >4 mm.

In the case in which the base layer 20 covers a larger area than support zone 11, according to embodiment F, it is preferred that the carrier 10 has an offset 12 in the region of high adhesive force. This offset 12 is filled with a fill material 13 before applying the base layer 20 until the fill material 13 forms a flat carrier side 15 flush with the support zone 11. The fill material 13 is ideally a material which can be selectively dissolved or removed later by controlled action from the outside. These mechanisms for the action can be mechanical, optical and chemical methods or a combination of these methods. For example, materials, especially plastics, could be used which can be dissolved by means of a certain solvent. According to one alternative embodiment inorganic materials would also be possible which can be dissolved by means of special etching chemistry. Furthermore, materials would also be conceivable which can be dissolved under the action of ultraviolet (UV) radiation or infrared (IR) radiation. The offset 12 is made such that the support zone 11 with low holding force roughly, especially precisely, extends to a step 17 of the offset 12. The step 17 can be made either in the form of a right-angled edge or also an obliquely running edge. It is advantageously possible to produce edges running obliquely in this way by means of a wet etching process, its enabling the crystal structure of silicon to automatically produce these oblique edges.

The base layer 20 can be applied either by means of spin or spray coating or lamination. In isolated cases other methods are also possible, such as doctoring, casting, extrusion coating or the like.

In one preferred embodiment of the invention the material of the base layer 20 is a photostructurable material, especially a photostructurable dielectric. For example, benzocyclobutene, WPR 5100 (from JSR®), SiNR® from ShinEtsu Chemicals® or similar products from Hitachi Chemicals or Sumitomo Bakelite, as well as polyimides, could be used here. One skilled in the art knows these materials and can select them according to the requirements which are defined by the final application and the production process flow. In one preferred embodiment (A, B, C, D and H) conductor paths 21 for the required wiring levels of the chips 30 can be produced building on the base layer 20. This generally takes place by means of lithography and additive processes. For example, the insulation between the individual conductors can be produced with the aforementioned photosensitive dielectric materials while the metallic connections can be produced by means of barrier seed deposition (sputtering) and electrochemical deposition (electroplating). These processes are conventional in the industry and are known to one skilled in the art. Subsequently contact pads 22 are produced which will be used later to hold and bond the chips 30. Together with these contact pads 22 ideally there are also alignment marks 25 which enable exact alignment of the chips 30 relative to the base layer 20. Thus an external alignment means can be omitted; this leads to much more exact alignment of the chips 30.

In one alternative embodiment G the base layer 20 is simply exposed and after exposure is subjected to a heating process ("post exposure bake"). This sequence leads to the exposed sites being chemically interlinked in the case of a negative resist, and thus being insoluble to the developer liquid, while the unexposed sites remain soluble. For a positive resist it behaves exactly the opposite: The exposed sites remain poorly soluble. Here it should be noted for the sake of completeness that most dielectric materials have the behavior of a negative resist. Then interconnection layers can be built up directly on the base layer 20 which has already been exposed analogously to processes A, B, C, D and H or chips 30 are placed directly on the base layer 20. In this case it can be an advantage to apply the chips 30 before heating of the exposed dielectric, and later to advantageously use the crosslinking process also to obtain a permanent adhesive connection (bond connection) between the chips 30 and the dielectric material of the base layer 20 (embodiment G).

Another alternative embodiment (process flow F according to FIGS. 9F1 to 9F7) calls for the chips 30 to be cemented only on the base layer 20. This can take place with the aid of an additional adhesive or using possible adhesive properties of the correspondingly chosen material of the base layer 20. It is conceivable as claimed in the invention that the chips 30 are cemented by means of a so-called die attach adhesive. Alternatively the material of the base layer 20 could be a dielectric, especially one of the above described materials which in the unexposed state could largely have the behavior of a thermoplastic. Thus the chips 30 could be fixed by means of a thermomechanical adhesive method.

For the embodiments A, B, C, D and H, after producing the contact pads 22 the chips 30 or chip stacks 31 (which are formed from at least one chip 30 at a time) are positioned. This can be done by means of current chip-to-wafer bonding methods, typically the chips 30 being fixed beforehand by means of a temporary adhesive and only later a permanent bond being formed in a reflow process. The embodiments A and B in this connection represent one version with bumps 36 in which the chips are fixed by means of a flux or no-flow underfill. Only after all chips 30 are placed on the base layer 20 does the carrier 10 with a plurality of chips 30 fixed beforehand pass through a thermal process ("reflow process") in which the bumps 36 and the contact pads 22 are soldered to one another. Here the flux ensures that oxidation of the contact surfaces does not occur during heating. Alternatively a so-called no-flow underfill can assume the same function and remains later a permanent part of the bond interface between the chips 30 and thus provides for improved mechanical stability. Thus the no-flow underfill saves the later underfilling of gaps between the chips 30 (shown in process A and B). When using these no-flow underfill materials it is also often necessary to apply pressure to the chips during the thermal process; this takes place advantageously by means of a pressure plate which can apply pressure simultaneously to all chips located on the carrier.

In the embodiments C, D and H connections are shown which omit the bumps 36 and use planar surfaces instead. This enables more dense connections in a further sequence since the otherwise conventional bumps 36 are omitted. This special form of the connection is conventionally produced by means of the so-called "transient liquid phase (TLP)" bonding process. Here eutectic metal connections are formed in which a first metal diffuses from the liquid phase into a second metal and with the latter forms stable intermetallic connections with a melting point which is above that of the first metal. Thus, bond connections can be implemented at a low temperature and later have a melting point which is above the original bond temperature. This makes these connections especially suitable for the stacking of several chip layers 33 of chips 30, since with them the connections of the already bonded plane are no longer adversely affected. One typical example for this bond connection would be connections of copper and tin. But other possibilities would also be copper and indium, gold and tin, nickel and tin, and gold and indium. Thus, for example the bond temperature for this copper-tin bond interface is for example 270° C. to 280° C. while the completed interface has a temperature stability of at least 415° C. The chips 30 and chip stacks 31 shown in process flows C, D, and H are fixed before the thermal process by means of a temporary adhesive which vaporizes later in the thermal process for producing the permanent metallic bond. For example the use of bibenzyl is recommended here. Here it is possible to produce the chip stacks 31 either chip layer 33 on chip layer 33 in several steps consisting of chip placement and a thermal process for forming the permanent bond interfaces, or of a single placement step and a single thermal process sequence. The same also applies analogously to the process sequences A and B.

In a further sequence, the chip stacks 31 are optionally underfilled to achieve an improved mechanical stability by means of underfill material. Alternatively it is also conceivable, instead of the above described temporary adhesive, to use a material which remains a permanent part of the chip stack after completion of the thermal process for producing the metallic connections. In particular the material could again be a so-called no-flow underfill material or other suitable material from the group of aforementioned dielectrics. Hybrid bond interfaces consisting of a metallic contact surface which are surrounded by a nonmetallic electrically insulating region are also conceivable. One example for this would be metallic contact surfaces which are surrounded by silicon oxide. Here the silicon oxide can also be used with the corresponding good quality to fix the chips at room temperature by means of Van der Waals bonds which are converted later into a permanent bond connection by a thermal process.

In processes E and F, the chips 30 are connected among one another by means of suitable methods. For example they can be the lithography method as shown in embodiment F. Again, materials and methods can be used as described above. In particular here the application of the dielectrics by means of spray coating is suitable to be able to embed the chips, and in order to be able to planarize the significant topography which is formed by the chips 30.

Embodiment E shows a version in which at least one part of the connections is also produced by means of wire bonding.

These two versions E and F are intended to show the flexibility of the method and make it clear that this invention is an extremely versatile method which makes it possible to incorporate a plurality of connection technologies at the same time.

After completing any connections and the underfill process, the remaining free spaces are filled with a potting compound (molding compound). It is used to stabilize and especially to enlarge the chips/chip stacks.

The exception here is embodiment F in which molding compounds are omitted, as a result of which especially thin and compact packages can be achieved. When in this case the chip thicknesses are selected to be correspondingly thin, and the dielectric materials have a corresponding mechanical durability, this can be a mechanically very flexible (pliable) package of chip stacks 31 potted into a layer material 40 which corresponds to the material of the base layer 20, the chip stacks being suitable in particular for special applications in which this flexibility is advantageous. For example, they could be smart card applications or applications in which the package is to be mounted on a bent surface.

Following the potting step, the hybrid wafer 34 is detached from the carrier 10. This is advantageously possible when the carrier 10 is made as described in embodiment H. In this case first the fill material 13 which is made as suitable adhesive is dissolved. Subsequently the hybrid wafer 34 can be lifted off the carrier 10. This lifting advantageously takes place in such a manner that either the flexibility of the carrier 10 and/or of the hybrid wafer 34 is used such that the lifting process is started from a defined site, and a separating wave runs from the starting point over the entire surface and ultimately separates the hybrid wafer 34 from the carrier 10. But at least the separating wave must run from the edge to the center of the carrier 10. In order to promote and/or initiate the start of this separating wave it can be helpful and necessary for a mechanical separating element to be introduced into the interface between the carrier 10 and hybrid wafer 34. This could be for example a wedge or a cone or blade. A tensioned wire with a suitable cross section is also conceivable. Alternatively the separating process could be initiated and/or supported by means of water or gas jet.

The method sequence in the embodiment F is as follows according to FIGS. 9F1 to 9F7:

In the process step shown in FIG. 9F1, the base layer 20 is applied to the carrier 10 with its fill layer 19 which forms the support zone 11. The base layer 20 completely covers the support zone 11 and projects slightly over it. The annular section of the base layer 20 which projects over the support zone 11 rests on the complete periphery of the base layer 20 on the adhesion zone 14 which has an adhesion force which is stronger than the adhesion zone per unit of area by a factor of at least 3. Thus the base layer 20 is held essentially solely in the adhesion zone 14.

Then, as shown in FIG. 9F2, chips 30 on the side of the base layer 20 facing away from the carrier 10 are applied to the base layer 20 with a pick and place tool. Chips 30 can be applied in several layers. On the side of the outermost chip 30 which face away from the base layer 20, contact pads 22 are applied which are used for later bonding by circuit paths 21 (see FIG. 9F4) in the form of fan-out bonding structures.

In the step shown in FIG. 9F3, a layer material 40 which corresponds to the material of the base layer 20 is applied in blanket form to the base layer 20, the layer material 40 being made during application such that it penetrates into the free spaces which have been formed between the chip stacks 31 without bubble formation.

In the process step shown in FIG. 9F4, circuit paths 21 are built up especially in layers and are formed for bonding of the contact pads 22 and/or adjacent chips 30. The circuit paths can be produced by lithography steps or by a stamping method.

In the process step shown in FIG. 9F5, the fan-out bonding structures 21 provided for bonding of a circuit board are routed out of the layer material 40, the terminals of the fan-out bonding structures 21 being provided with terminal bumps 50 which are used for connection of the hybrid wafer 34 according to FIG. 9F7 to a corresponding circuit board.

In the step shown in FIG. 9F6 the carrier 10 has been removed from the base layer 20 essentially by action on the adhesion zone 14 in the above described manner.

FIG. 9F7 shows an isolated chip stack 31 in which a likewise isolated base part 26 of the base layer 20 is used as a carrier.

FIGS. 10G1 to 10G11 show production according to embodiment G. The first method step according to FIG. 10G1 corresponds to the method step according to FIG. 9F1, in the same manner as the method steps shown in FIGS. 1A, 1B, 1C, 1D and 1E.

In the method step as shown in FIG. 10G2, a photomask 90 for lithography treatment is arranged aligned over the base layer 20 and the base layer 20 is exposed in the method step according to FIG. 10G3 through the photomask 90.

In the region of the exposed exposure sites 27 of the base layer 20 according to FIG. 10G4, chips 30 are built up into chip layers 31 via contact pads 22. Chip alignment marks 38 on the chip edge 37 are used for alignment of the chips 30 to one another and to the base layer 20.

In the method step according to FIG. 10G5, the chips 30 are potted with a layer material 40 over the entire surface on the base layer 20.

In the process step according to FIG. 10G6 the carrier 10 is removed analogously to FIG. 9F6 and in the method step according to FIG. 10G7 the hybrid wafer 34 is placed on its head, i.e., inverted or reversed.

In the method step according to FIG. 10G8, the exposure sites 27 of the base layer 20 are exposed, especially by etching, whereupon in the method step according to FIG. 10G9 the circuit paths 21 are formed in the exposure sites 27 which have been revealed.

In the method step according to FIG. 10G10 terminal bumps 50 are bonded to the circuit paths 21 for connection of the chip stacks 31 to the circuit board.

In the method step according to FIG. 10G11 the chip stacks 31 of the hybrid wafer 31 are isolated.

In the especially preferred embodiment H according to FIGS. 11H1 to 11H9 the base layer 20 according to FIG. 11H1 is applied analogously to the method according to FIG. 9F1 with the difference that the carrier 10 in the adhesion zone 14, therefore following the support zone 11, has an offset 12 which extends back relative to the carrier side 15, more or less forms a shoulder. Before the base layer 20 is applied to the carrier 10, the offset 12 is filled with an adhesively acting fill material 13 so that the fill material 13 is made flush with the support zone 11. The base layer 20 rests at least partially on the fill material 13 in a ring section of the top of the fill material 13. The fill material 13 thus forms the adhesion zone 14 at least in part.

Figure 2A:
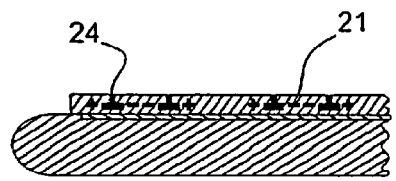
Figure 2B:
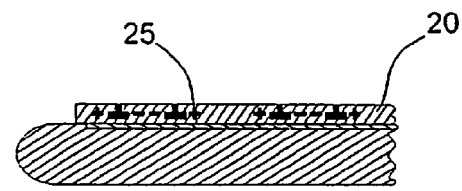
Figure 2C:
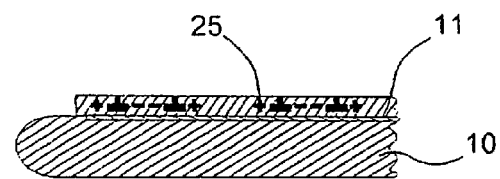
Figure 2D:
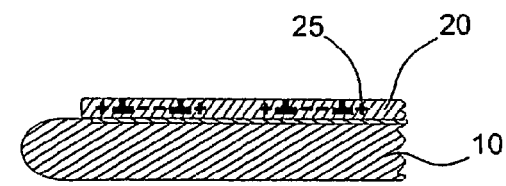
Figure 2E:
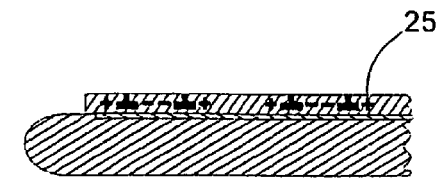

The method step according to FIG. 11H2 corresponds to the method step according to FIG. 2D (embodiment D) in which the conductor paths 21 and the alignment marks 25 are made in the base layer 20.

Figure 3A:
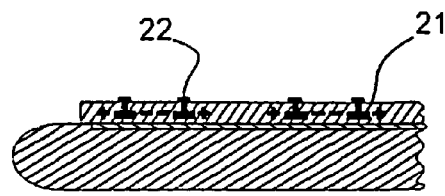
Figure 3B:
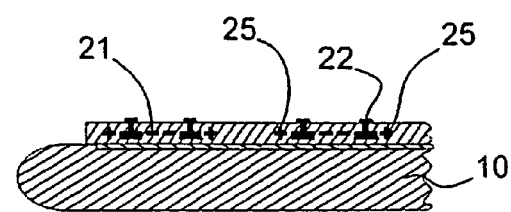
Figure 3C:
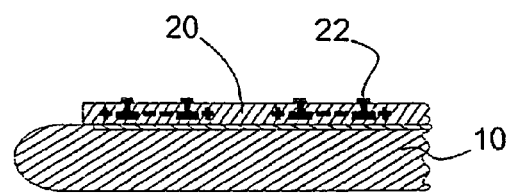
Figure 3D:
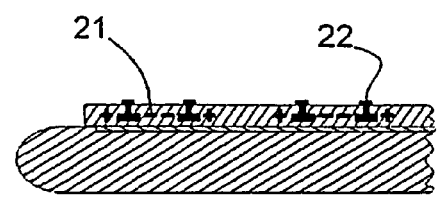
Figure 3E:
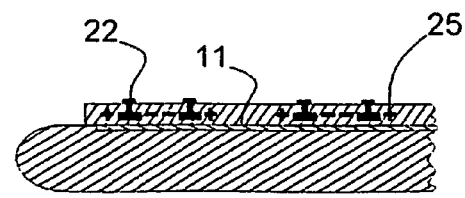

The method step according to FIG. 11H3 corresponds to the method step according to FIG. 3D in which the contact pads 22 are applied to the base layer 20 at the contact sites to the conductor paths 21 which form the fan-out bonding structures at the same time.

Figure 4D:
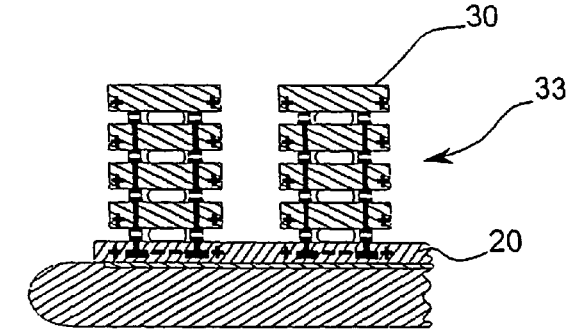
Figure 4E:
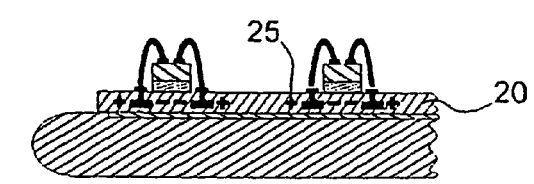
Figure 6A:
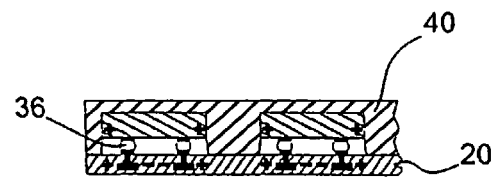
Figure 6B:
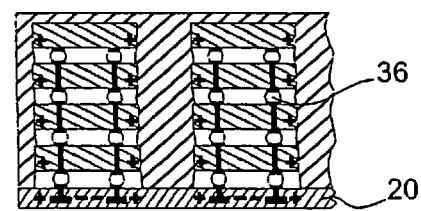
Figure 6C:
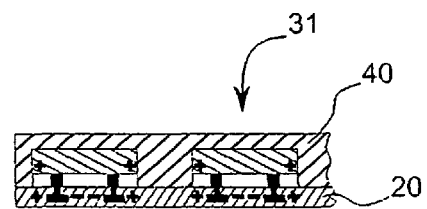
Figure 6D:
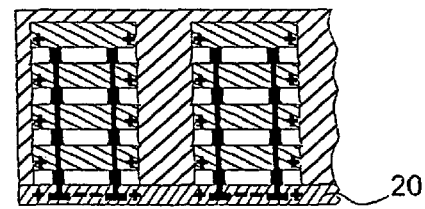
Figure 6E:
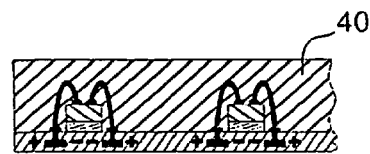
Figure 7A:
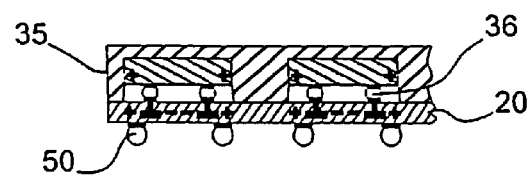
Figure 7B:
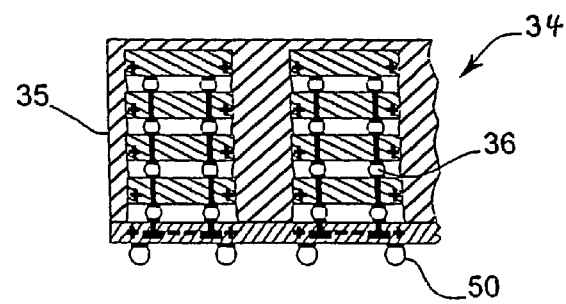
Figure 7C:
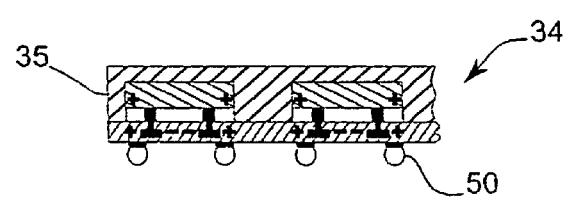
Figure 7D:
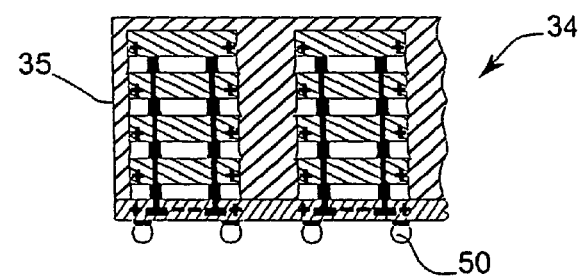
Figure 7E:
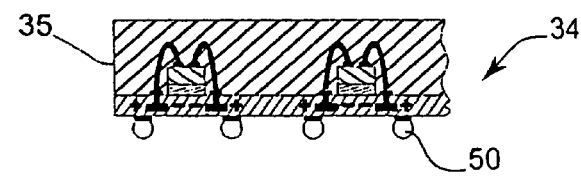
Figure 8A:
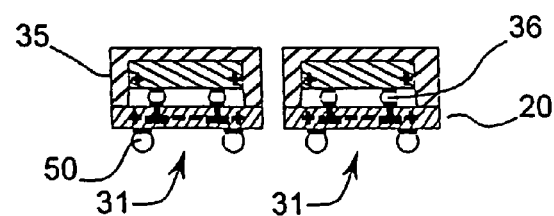
Figure 8B:
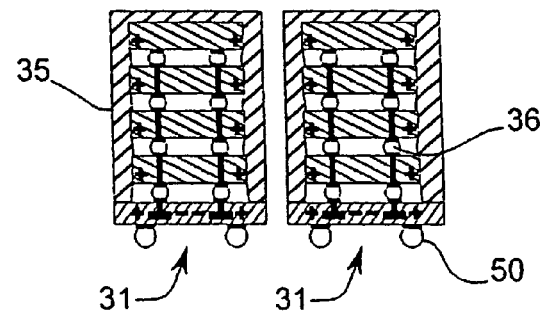
Figure 8C:
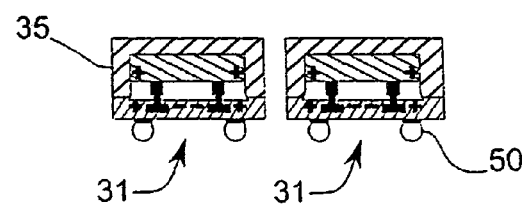
Figure 8D:
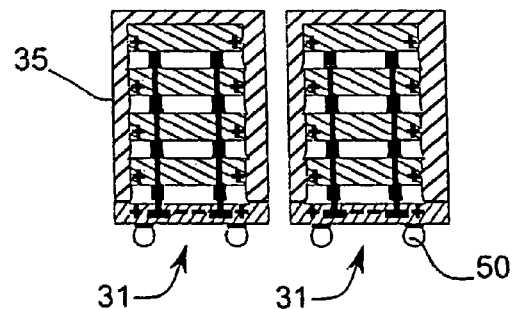
Figure 8E:
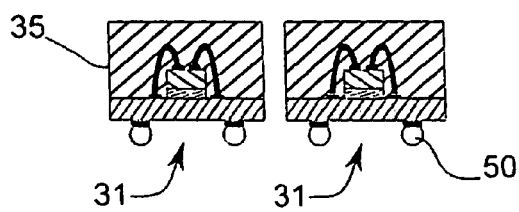

The method step according to FIG. 11H4 corresponds to the method step according to FIG. 4D in which the chip stacks 31 are formed by stacking of chips 30 in four chip layers 33. The chips 30 of the chip layers 33 are interconnected by TSVs and the contacts which connect the respective TSVs.

In the method step according to FIG. 11H5 which corresponds to the method step according to FIG. 5D the chip stacks 31 are potted by layer material 40.

In the method step according to FIG. 11H6, the fill material 13 is removed by the corresponding solvent which acts selectively relative to the fill material 13 so that in the following method step according to FIG. 11H7 the carrier 10 can be easily detached from the hybrid wafer 34.

In the method step according to FIG. 11H8 terminal bumps 50 are bonded on the base layer 20 with the corresponding contact sites of the fan-out contact structures.

The chip stacks 31 are isolated in the method step according to FIG. 11H9.

The invention claimed is:

1. Method for producing chip stacks comprising the steps of:
   providing a carrier having a carrier side, said carrier side having an adhesively-acting adhesion zone and a less-adhesively-acting support zone,
   applying a base layer to said carrier side of said carrier by at least one of the following: spin coating or spray coating, the base layer being applied primarily to the support zone,
   building up chip stacks on the base layer, wherein the base layer supports at least partially the chip stacks,
   detaching the carrier from the base layer.

2. Method as claimed in claim 1, wherein on the carrier side in the adhesion zone there is a selectively soluble fill material, especially on an offset which has been set back relative to the carrier side, preferably superficially flush toward the carrier side.

3. Method as claimed in claim 1, wherein the base layer is applied over the entire surface of the support zone and at least partially to the adhesion zone.

4. Method as claimed in claim 1, wherein before detachment of the carrier, the chip stacks are separated from each other by cutting, wherein the chip stacks are only still connected to the carrier.

5. Method as claimed in claim 1, wherein the material which forms the base layer is flexible.

6. Method as claimed in claim 1, wherein fan-out bonding structures are made in the base layer before building up the chip stacks.

7. Method as claimed in claim 6, wherein before building up the chip stacks on one chip side facing away from the carrier side contact pads for electrical bonding of the chip stacks with the fan-out bonding structures are applied.

8. Method as claimed in claim 6, wherein alignment marks are provided for positioning/placement of the contact pads and/or the chip stacks on the base layer, said alignment marks being flush with one edge of the chip stacks, in/on the base layer.

9. Method as claimed in claim 1, wherein the chip stacks are cemented directly on the base layer by bonding.

10. Method as claimed in claim 1, wherein after building up the chip stacks and before detaching the carrier the chip stacks are potted with a layer material which corresponds especially to the material of the base layer.

11. Method as claimed in claim 2, wherein the carrier is detached from one side edge of the carrier, especially by reducing the adhesion force of the adhesion layer, preferably by selective dissolution of the selectively soluble fill material.

12. Method as claimed in claim 1, wherein base parts of the base layer form one part of each chip stack.

13. Method for producing chip stacks with the following method sequence:
   providing a carrier having a carrier side, said carrier side having an adhesively-acting adhesive zone and a less-adhesively-acting support zone,
   subjecting a contact surface of the adhesion zone to surface modification to reduce the free surface energy,
   applying a base layer to said carrier side of said carrier by at least one of the following: spin coating or spray coating, the base layer being applied over the entire surface to the adhesion zone,
   building up chip stacks on the base layer, wherein the base layer will at least partially get part of the chip stacks, and
   detaching the carrier from the base layer.

14. A carrier which is provided on one carrier side with an adhesively acting adhesion zone and a less adhesively acting support zone, a base layer being applicable at least predominantly to the support zone, and on the carrier side in the adhesion zone there being a selectively soluble fill material on an offset which is set back relative to the carrier side wherein the base layer is applied by at least one of the following: spin coating or spray coating.

15. Method for producing chip stacks comprising the steps of:
   providing a carrier having a carrier side, said carrier side having an adhesive layer applied to a portion of said carrier side to define an adhesively-acting adhesive zone and a portion of said carrier side being free of said adhesive layer to define a less-adhesively-acting support zone,
   applying a base layer to said carrier side of said carrier by at least one of the following: doctoring, casting or extrusion coating, the base layer being applied primarily to the support zone,
   building up chip stacks on the base layer, wherein the base layer supports at least partially the chip stacks,
   detaching the carrier from the base layer.

16. A carrier having a carrier side, said carrier side having an adhesive layer applied to a portion of said carrier side to define an adhesively acting adhesion zone and a portion of said carrier side being free of said adhesive layer to define a less adhesively acting support zone, said carrier including:
   a base layer applied at least predominantly to the support zone, said base layer being applied by at least one of the following: doctoring, casting or extrusion coating, and
   a selectively soluble fill material disposed on the carrier side in the adhesion zone, wherein said fill material is disposed in an offset that is recessed relative to the surface of the carrier side.

17. Method as claimed in claim 15, wherein only an outer peripheral region of at least one of said chip stacks contacts said adhesive layer on said carrier side of said carrier.

18. Method as claimed in claim 15, wherein said adhesive layer is applied only to an outer peripheral region of said carrier side or to an outer peripheral region of said base layer.

19. Method as claimed in claim 18, wherein said adhesive layer has a ring width of between 0.5 mm and 10 mm.

20. Carrier as claimed in claim 16, wherein said adhesive layer is disposed at only an outer peripheral region of said carrier side or at an outer peripheral region of said base layer.

21. Carrier as claimed in claim 20, wherein said adhesive layer has a ring width of between 0.5 mm and 10 mm.

22. Method for producing chip stacks comprising the steps of:
- providing a carrier having a carrier side, said carrier side having an adhesively-acting adhesive zone and a less-adhesively-acting support zone,
- applying a base layer to said carrier side of said carrier by laminating, the base layer being applied primarily to the support zone,
- building up chip stacks on the base layer, wherein the base layer supports at least partially the chip stacks, and
- detaching the carrier from the base layer.

23. Method as claimed in claim 22, wherein said base layer is laminated to only the adhesively-acting adhesive zone of the carrier side.

\* \* \* \* \*